United States Patent [19]

Savov et al.

[11] Patent Number: 4,648,952
[45] Date of Patent: Mar. 10, 1987

[54] METHOD OF CONTROLLING THERMOCHEMICAL TREATMENT OF WORKPIECES IN GLOW DISCHARGE IN A TREATING GAS MEDIUM AND DEVICE WHICH EMBODIES THIS METHOD

[75] Inventors: Svetoslav A. Savov; Mintcho S. Mintchev; Peter T. Nitchev; Georgi S. Shivarov, all of Sofia, Bulgaria

[73] Assignee: VMEI "Lenin", Sofia, Bulgaria

[21] Appl. No.: 802,211

[22] Filed: Nov. 26, 1985

[30] Foreign Application Priority Data

Nov. 26, 1984 [BG] Bulgaria ................................. 67672

[51] Int. Cl.$^4$ ............................................. C23C 15/00
[52] U.S. Cl. .......................... 204/192.12; 204/192.3; 204/192.33; 204/298
[58] Field of Search ............... 204/298, 192 R, 192 E, 204/192 EC

[56] References Cited

U.S. PATENT DOCUMENTS 4,313,783  2/1982  Davies et al. ........................ 204/298
4,396,478  8/1983  Aizenshtein et al. ............ 204/192 R
4,500,408  2/1985  Boys et al. ........................... 204/298
4,533,449  8/1985  Levenstein .......................... 204/298

OTHER PUBLICATIONS

Chandler et al., Thin Solid Films 86(1981), pp. 183–191.

Primary Examiner—Arthur P. Demers
Attorney, Agent, or Firm—Karl F. Ross; Herbert Dubno

[57] ABSTRACT

The method and device for controlling the thermo chemical treatment of workpieces in slow discharge in a medium of treating gas, includes operating stages of warm-up with simultaneous intensive cathode sputtering, diffusion saturation, and cooling of treated workpieces. During each stage the workpiece temperature, the frequency of occurring arc discharges and the glow discharge voltage are measured and compared with preset values. Corresponding error signals and control signals are obtained and used to regulate the treated workpiece temperature and the arc discharge frequency using the discharge current value, and the glow discharge voltage using the flow rate value of one of at least two treating gases that enter the working chamber, a preset value of glow discharge voltage corresponding to each treating gas.

2 Claims, 4 Drawing Figures

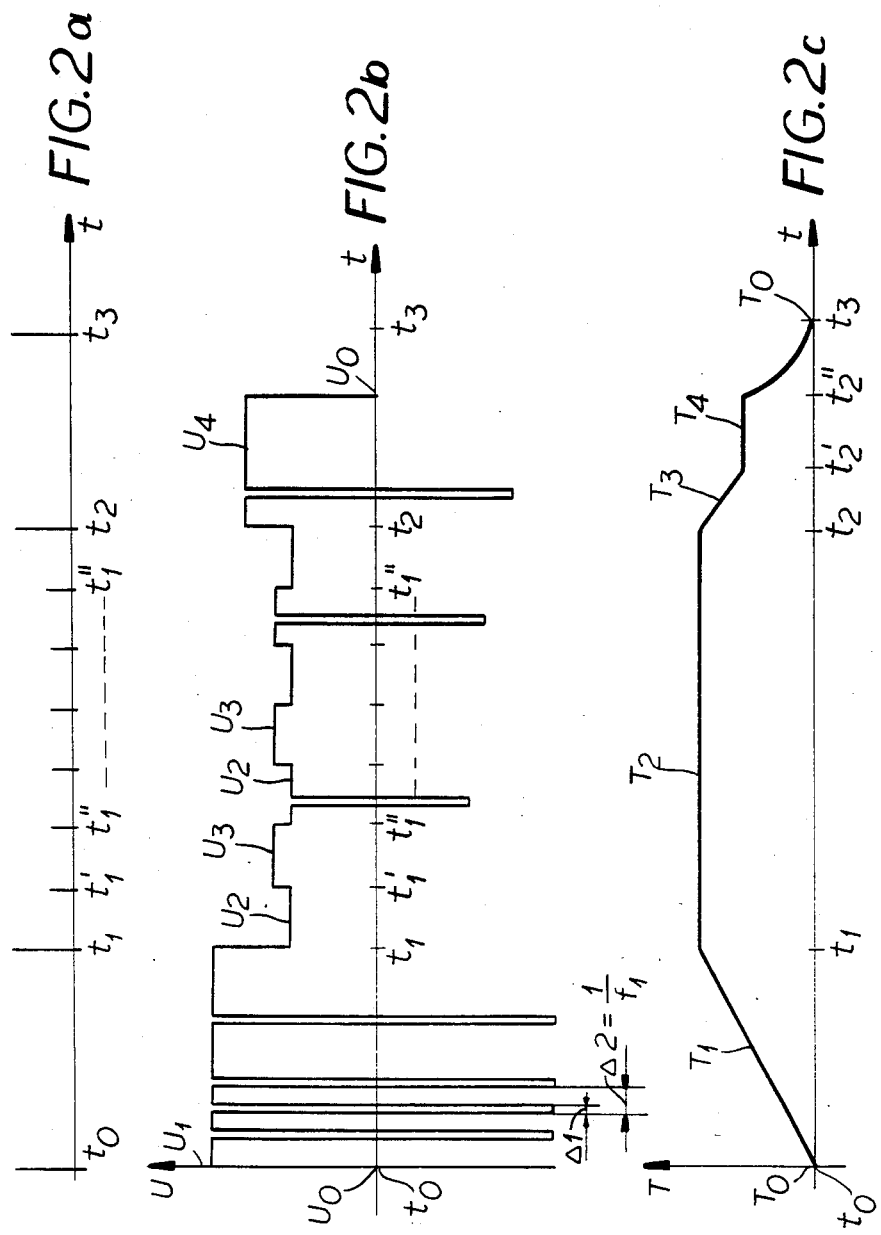

METHOD OF CONTROLLING THERMOCHEMICAL TREATMENT OF WORKPIECES IN GLOW DISCHARGE IN A TREATING GAS MEDIUM AND DEVICE WHICH EMBODIES THIS METHOD

FIELD OF THE INVENTION

The present invention is related to a method of controlling the thermochemical treatment of workpieces in glow discharge in a medium of treating gas and a device embodying this method, which can be applied in the machine-tool industry, e.g. for the control of machine part treatment in nitriding apparatuses.

BACKGROUND OF THE INVENTION

A method of controlling the thermochemical treatment of workpieces in glow discharge in a medium of treating gases, which involves two operating stages, is already known; the first stage includes workpiece warm-up with simultaneous intensive cathode sputtering on their surface, and during the second one diffusion saturation of workpieces is carried out. In both operating stages the temperature of the workpieces in the working chamber, the temperature variation rate and the frequency of the occurring arc discharges are measured. The measured values of these parameters are compared with the corresponding preset values, and error signals are obtained. These error signals are used to create control signals for the mean value and the amplitude of glow discharge voltage. The control signal for the amplitude of glow discharge voltage regulates the frequency of arc discharges in the working chamber so that it will corespond to its preset value, and the control signal for the mean value of glow discharge voltage regulates the temperature of the treated workpieces so that it will correspond to its preset value.

One disadvantage of the method of controlling the thermochemical treatment in glow discharge in a medium of treating gases is the small efficiency of cathode sputtering during warm-up stage, which is due to the fact that it is impossible to preset such an amplitude of glow discharge voltage which would correspond to a preset intensity of the cathode sputtering. Another disadvantage of this method is the complicated control algorithm requiring simultaneous control of both means value and amplitude of glow discharge voltage. A major disadvantage of the method is the impossibility to obtain a satisfactory reproducibility of the results of workpiece treatment because only the workpiece temperature and the frequency of occurring arc discharges are stabilized, while other characteristic parameters influencing the qualtiy of the workpiece treatment are not intended to be used by this method.

A device for controlling thermochemical treatment of workpieces in glow discharge in a medium of treating gas, which includes a power supply having one output and two control inputs, is known; said first input controlling the mean value of output voltage, and said second input controlling the amplitude of output voltage. It also includes a sensor for workpiece temperature measurement which is connected thermally to the treated workpieces, and its output is joined up by series-connected measuring element for the temperature variation rate, comparing element for the temperature rate, and thermoregulator to the first input of a control unit. The temperature sensor output is also joined up by series-connected second comparing element and second thermoregulator to the second input of the control unit. The output of the second comparing element is applied to the third input of the control unit. The input of a converter for the glow discharge voltage is connected with the output of the power supply. The converter output is applied to the fourth input of the control unit, and through series-connected frequency-to-voltage converter, third comparing element and third thermoregulator to the fifth input of the control unit. In the circuit of power supply and working chamber a current sensor is connected in series; its output being applied to the second input of a sensor for arc discharge frequency. Preset value sources for the workpiece temperature, its variation rate and the frequency of occurring arc discharges are connected with second inputs of the corresponding comparing elements.

A disadvantage of the above-described device is the complicated circuit embodying a complex operating algorithm as well as the use of an electric power supply circuit with two control inputs.

OBJECT OF THE INVENTION

It is therefore an object of the present invention to provide such a method of and a device for controlling thermochemical treatment of workpieces in glow discharge in a medium of treating gas, which ensure a higher efficiency of the cathode sputtering, less complexity of control algorithm and device circuit, increased degree of workpiece protection against occurring arc discharges, and improved result reproducibility of workpiece treatment.

SUMMARY OF THE INVENTION

The above-mentioned object can be achieved with the help of a method of controlling thermochemical treatment of workpieces in glow discharge in a medium of treating gases, which involves the following operating stages. A stage of workpiece warm-up-with simultaneous intensive cathode sputtering on their surface; the glow discharge voltage having at least one constant value corresponding to a preset value, at which the cathode sputtering of workpieces has a preset intensity. A stage of diffusion saturation at preset workpiece temperature; the glow discharge voltage having another at least one constant value corresponding at least to one preset value, at which the described workpiece properties are obtained. A stage of workpiece cooling when the glow discharge voltage has at least one third constant value corresponding to at least one preset value, at which the final workpiece properties are obtained. During the operating stages the frequency of the occurring arc discharges has an arbitrary value limited in magnitude by a preset value of the arc discharge frequency. The workpiece temperature always has a value which corresponds to a preset increasing, constant and decreasing value of the workpiece temperature; this value being matched with the mentioned at least one preset value of the glow discharge voltage which provides the preset intensity of cathode sputtering, the desired and final properties of workpieces. During operating stages appropriate treating gases are used. These gases are intentionally arranged in an order which conforms to a sequence of preset values of the glow discharge voltage. The glow discharge voltage is controlled by regulating the flow rate of treating gases. During the operating stages the workpiece temperature, the frequency of occurring arc discharges, the glow discharge current, and the amplitude of glow discharge voltage are measured. The measured values of the workpiece temperature, the frequency of the occurring arc discharges and the amplitude of glow discharge voltage are compared with their preset values, correspondigly, and corresponding error signals are obtained. Simultaneously, the error signals of the workpiece temperature and the frequency of the occurring arc discharges are used to create corresponding control signals for the temperature of treated workpieces and the frequency of occurring arc discharges which are added together after that. The obtained compound signal is compared with the signal which is proportional to the discharge current. The error signal obtained is used to create a control signal for the glow discharge voltage, so that the glow discharge current will correspond in accordance with the PID law to the compound signal of control signals for the workpiece temperature and the frequency of occurring arc discharges. The error signal of the amplitude of glow discharge voltage is used to create a control signal for the flow rate of treating gas, so that in accordance with another PID law the amplitude of glow discharge voltage will correspond to the preset amplitude value.

The fore-mentioned object can also be achieved with the help of a device for controlling thermochemical treatment of workpieces in glow discharge in a medium of treating gas, which includes a source of DC voltage; one terminal of the source output being connected through a current sensor to the corresponding terminal of the electric input of working chamber, and the other terminal of its output being connected through a smoothing choke to the other terminal of the electric input of working chamber. A voltage sensor and a device for interrupting arc discharges are mounted across the electric input of working chamber. The treated workpieces are thermally connected with a temperature sensor whose output is applied to the frist input of a first comparing element; the second input of this comparing element being connected with the first output for preset temperature of a programming unit. The output of the first comparing element is connected through a first regulator to the first input of an adder whose output is applied to the first input of a second control unit; the second input of said second control unit being connected with the output of current sensor, and its output is applied through a second regulator to the control input of DC voltage source. The output of voltage sensor is connected through a frequency-to-voltage converter to the first input of a third comparing element whose output is applied through a third regulator to the second input of the adder. The second input of the third comparing element is connected to a source of a preset constant value of the arc discharge frequency. The output of voltage sensor is also connected through an amplitude detector to the first input of a fourth comparing element whose output is applied through a fourth regulator to the first input of a switch, its second control input being connected with the second output for preset treating gas of the programming unit. The third output of the programming unit which presets the amplitude of glow discharge voltage is applied to the second input of the fourth comparing element. The outputs of the source of treating gases are connected with the gas inputs of at least two actuators for flow rate regulation whose outputs are connected together in a common point and to the gas input of working chamber. The control inputs of the actuators for flow rate regulation are connected with the corresponding switch outputs. The gas output of working chamber leades through a vacuum pump to the outside atmosphere.

The advantages of the method of and the device for controlling the thermochemical treatment of workpieces in glow discharge in a medium of treating gas according to the present invention are: the increased efficiency of cathode sputtering during the heating stage which is achieved by using a preselected constant value of glow discharge voltage, the smaller complexity of control algorithm and device circuit due to the use of a DC voltage source with one input controlling the output voltage and the dosage of treating gases by using preset values of glow discharge voltage corresponding to the individual gases, the increase in the workpiece protection degree against the occurring arc discharges by using a discharge current which is not changing its value when an arc discharge exists in working chamber, and the improvement in result reproducibility for the workpiece treatment by using preset values of workpiece temperature and glow discharge voltage.

BRIEF DESCRIPTION OF THE DRAWINGS

An illustrative embodiment of the present invention is shown with the accompanying drawings wherein:

FIG. 2a shows the sequence and the duration of operating stages and the order used treating gases.

FIGS. 2b and 2c illustrate how the voltage and the electric input of working chamber and the temperature of treated workpieces are varying with time.

SPECIFIC DESCRIPTION

Figure 1:
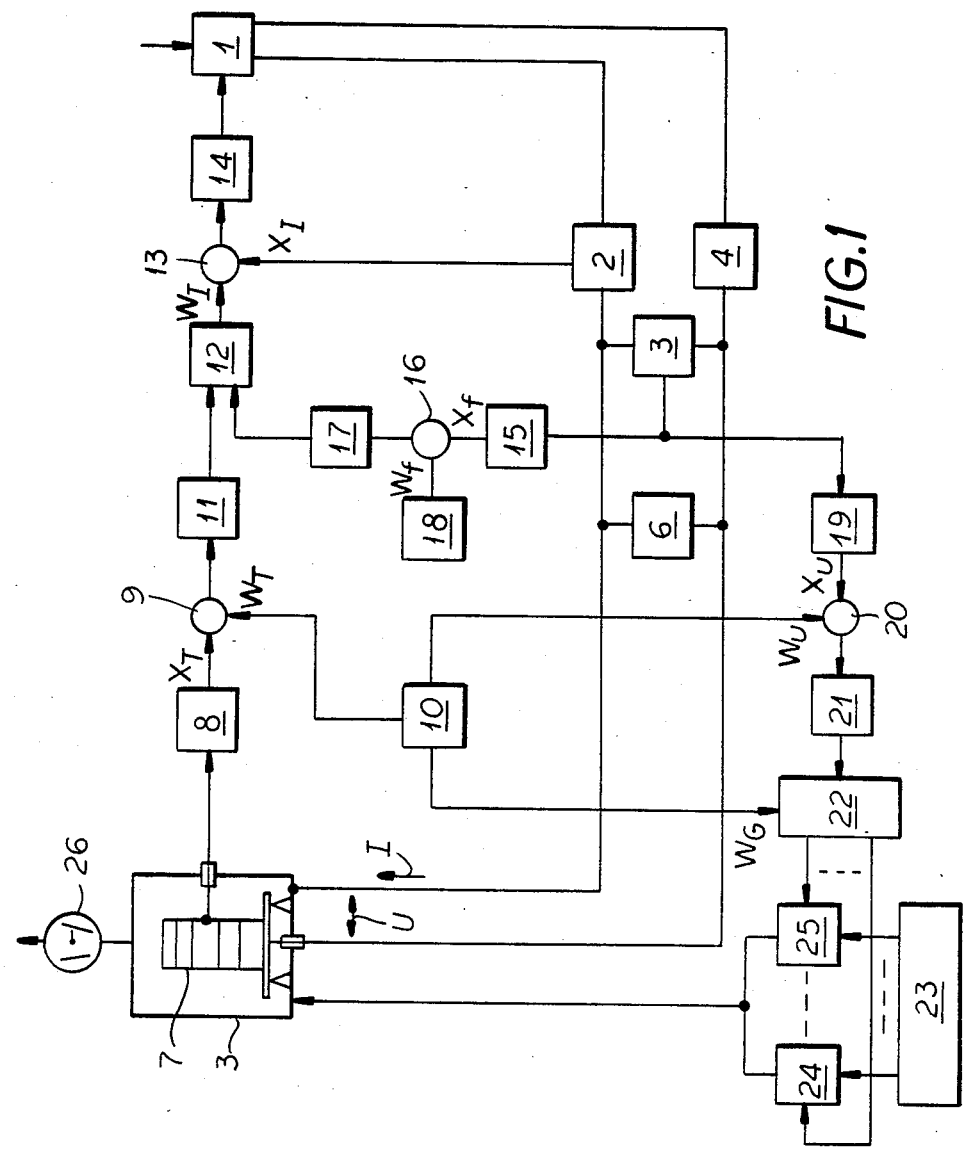
FIG. 1 is a schematic block diagram of the device.

The method of controlling thermochemical treatment of workpieces in glow discharge in a medium of treating gas involves the following operating stages: a stage of workpiece warm-up with simultaneous intensive cathode sputtering on their surface which starts at the initial time $t_o$ and ends at the time $t_1$, and a stage of diffusion saturation at preset constant temperature which starts at the time $t_1$ and ends at the time $t_2$, and a stage of workpiece cooling starting at the time $t_2$ and ending at $t_3$. The operatng stage duration $t_1$-$t_o$, $t_2$-$t_1$, $t_3$-$t_2$ are set in advance. As shown by FIG. 2a appropriate treating gases are used during operating stages i.e. a first treating gas is used in time period $t_1$-$t_o$, a second and a third treating gases are correspondingly used in time period $t_2$-$t_1$, and a fourth treating gas is used during time period $t_3$-$t_2$. At the initial time $t_o$, as illustrated by FIG. 2b and 2c, the treated workpiece temperature T has an initial value $T_o$, the voltage at the electric input of working chamber changes its value from zero ($U_o$) to the preset first value of glow discharge voltage $U_1$, and the working chamber is filled with a first treating gas. At the time $t_1$ the workpiece temperature $T_1$ reaches the preset constant value $T_2$, the glow discharge voltage goes down from $U_1$ to the preset second value $U_2$, and the first treating gas is replaced by a second treating gas. After the time $T_1$ the value of glow discharge voltage is $U_2$ or is equal to the preset third value $U_3$. $U_2$ and $U_3$ correspond to the preset time durations $t_1'$-$t_1$ and $t_1'''$-$t'_1$, respectively; a second treating gas being used during the first of these periods, and a third treating gas being used during the second one. By alternative change of periods $t_1'$-$t_1$ and $t_1'''$-$t'_1$ a dosage of second and third treating gases is carried out, this alternation helping to establish the preset proportion between these gases. From the time $t_1$ to the time $t_2$ the workpiece temperature T has the preset value $T_2$. At the time $t_2$ the workpiece temperature T has the value $T_2$, the glow discharge voltage reaches the preset fourth value $U_4$, and the third treating gas is replaced by a fourth treating gas. At the time $t_2'$ the workpiece temperature $T_3$ is decreased to the preset second constant value $T_4$, and at the time $t_2''$ the workpiece temperature T has the preset value $T_4$, the glow discharge voltage goes down from the preset value $U_4$ to the zero value $U_o$, and the supply of the fourth treating gas to the working chamber is interrupted. At the time $t_3$ the workpiece temperature T is descreased to its initial value $T_o$ which coincides with the end of the treatment. During the operating stages the following parameters are measured: the temperature of treated workpieces, the voltage at the electrical input of working chamber, the current through the working chamber and the frequency of occurring arc discharges. After the parameters are measured signals are obtained which correspond to the temperature of treated workpieces, the glow discharge voltage, the frequency of occurring arc discharges, and the glow discharge current. These signals are compared with signals which correspond to preset values of treated workpiece temperature, glow discharge voltage, and arc discharge frequency. After comparison error signals are obtained which are used to create corresponding control signals; these control signals are used further to regulate the temperature of treated workpieces, the frequency of occurring arc discharges, and the glow discharge voltage. In the stage of workpiece warm-up with simultaneous intensive cathode sputtering on their surface the glow discharge voltage has at least one constant value corresponding to at least one preset value $U_1$ which determines a preset intensity of workpiece cathode sputtering. During the stage of diffusion saturation at preset workpiece temperature the glow discharge voltage has at least two other constant values corresponding to preset values $U_2$ and $U_3$ which determine the desired properties of workpieces. In the stage of workpiece cooling the glow discharge voltage has at least one fourth constant value corresponding to a preset value $U_4$ which determines the final properties of workpieces. During the operating stages the frequency of occurring arc discharges has an arbitrary value, which depends on the degree of workpiece surface contamination at the initial time $t_o$ of the treatment and random factors in the rest of the time till the end of the treatment at $t_3$. The frequency of occurring arc discharges is represented by the reciprocal value of the repetition period of occurring arc discharges $\Delta_2$. The time when the arc discharge is no more existing has the value $\Delta_1$. At the beginning of the treatment the frequency of occurring arc discharges has a value which is not greater than the value of the preset frequency $f_1$. The workpiece temperature always has a value which corresponds to preset increasing value $T_1$, constant values $T_2$ and $T_4$ decreasing value $T_3$; these preset values corresponding to the operating stages. As an example in the stage of workpiece cooling a second constant value is used to hold the workpiece temperature for a time duration $t_2''-t_2'$. The value of the temperature during the operating stages is conveniently matched with the value of glow discharge voltage. The method described enables to obtain a cathode sputtering of preset intensity, the desired and final properties of workpieces. In the operating stages appropriate treating gases are used; these gases are intentionally arranged in an order as first, second, third and fourth treating gases. A sequence of preset values of the glow discharge voltage $U_1$, $U_2$, $U_3$, $U_4$ corresponds to this order. The glow discharge voltage is controlled by regulating the flow rate of the treating gases. The frequency of occurring arc discharges and the workpiece temperature are regulated through the glow discharge current by using the signal which corresponds to the measured value of this current; this signal further being compared with a compound reference signal obtained by adding the control signal connected with the workpiece temperature to the control signal connected with the frequency of occurring arc discharges. After comparison an error signal is obtained which is used to create a control signal connected as described above with the workpiece temperature and the frequency of occurring arc discharges. This control signal is used to control the electric source of DC voltage so that the glow discharge current will have a value which corresponds to the value of the compound reference signal. Simultaneous ly with workpiece temperature regulation the voltage at the electric input of working chamber is measured and the signal which correspond to the value of the frequency of occurring arc discharges and the value of glow discharge voltage are selected and obtained. These signals are compared with the signals which correspond to the preset values of the frequency of arc discharges $f_1$ and the glow discharge voltage $U_1$, $U_2$, $U_3$, $U_4$. After comparison corresponding error signals are obtained and used to create corresponding control signals so that the control signal connected with the frequency of occurring arc discharges is added in the manner described above to the control signal connected with the workpiece temperature. The control signal connected with the value of glow discharge voltage is used to regulate the flow rate of first, second, third, and fourth treating gases, correspondingly; these gases passing through the consecutively joined working chamber and continuously working vacuum pump to the atmosphere. The order of supplying treating gases conforms to a signal of treating gas selection. The flow rate regulation is used to create such a pressure in working chamber that its value will correspond to the value of glow discharge voltage.

A device for controlling thermochemical treatment of workpieces in glow discharge in a medium of treating gas according to FIG. 1 which includes a source of DC voltage 1, one terminal of its output being connected through a current sensor 2 with the corresponding terminal of the electric input of working chamber 3, and other terminal of its output is connected through the smoothingh choke 4 with the other terminal of the electric input of working chamber 3. A voltage sensor 5 and an unit for arc discharge interruption 6 are connected across electric input of working chamber 3. The treated workpieces 7 are connected thermally with a temperatire sensor 8 whose output is applied to the first input of a first comparing element 9, its second input being connected with the first output for preset temperature of a programming unit 10. The output of the first comparing element 9 is applied through a first regulator 11 to the first input of an adder 12 whose output is connected with the first input of a second comparing element 13, its second input being connected with the output of the current sensor 2, and its output is applied through a second regulator 14 to the control input of the source of DC voltage 1. The output of voltage sensor 5 is connected with the help of frequency-to-voltage converter 15 with the first input of a third compaing element 16 whose output is applied through a third regulator 17 to the second input of the adder 12. The second input of the third comparing element 16 is connected to a source of preset constant value for the arc discharge frequency 18. The output of voltage sensor 5 is also applied through an amplitude detector 19 to the first input of a fourth comparing element 20 whose output is connected with the help of a fourth regulator 21 with the first input of a switch 22; the second control input of said switch being connected with the second output for a preset treating gas of the programming unit 10. The third output of programming unit 10 for presetting the amplitude of glow discharge charge voltage is connected with the second input of the fourth comparing element 20. The outputs of a source for treating gases 23 are connected to the gas inputs of at least two actuators for flow rate regulation 24 respectively 25, the outputs of said actuators are connected in a common point and with the gas input of working chamber 3. The control inputs of the acutators for flow rate regulation 24 and 25 are connected with the corresponding outputs of switch 22. The gas output of working chamber 3 is lead to the outside atmosphere by a vacuum pump 26.

According to the present invention the operation of the device forcontrolling thermochemical treatment of workpieces in glow discharge in a medium of treating gas is as follows.

Until the time $t_o$, as a result of the action of vacuum pump 26 when the actuators for flow rate regulation 24 respectively 25 are in closed srate, the pressure in working chamber 3 is at a low limit which is determined by the performance of vacuum pump 26 and working chamber 3. The programming unit for the temperature 10 contains the preset values of glow discharge voltage $U_1$, $U_2$, $U_3$, $U_4$, the preset values of treated workpiece temperature $T_1, T_2$, $T_3$, $T_4$, the preset oder using the treating, and the time durations of operating stages $t_1$-$t_o$, $t_2$-$t_1$, $t_3$-$t_2$ as well as the time duration $t_1$ $t_1'$-$t_1$ and $t''_1$-$t'_1$. In the time $t_o$ the thermochemical treatment of workpieces 7 starts after connecting the electric power input of the DC voltage source 1 to the mains. The output voltage of DC voltage source 1 excites a glow discharge in the working chamber 3, the glow discharge voltage being measured by the voltage sensor 5. The occuring arc discharges are interrupted by the action of the unit for arc discharge interruption 6; As a result of the action of the unit for arc discharge interruption 6 the voltage at the electrical input of working chamber 3 is alternating in a pulse form and with amplitudes equal to the glow discharge voltage $U_1$. The amplitude detector 19 selects the value of glow discharge voltage. At the output of amplitude detector 19 a signal $X_u$ is obtained corresponding to the value of glow discharge voltage. The fourth comparing element 20 compares the signal $X_u$ with the signal $W_u$ which corresponds to the preset values of glow discharge voltage $U_1$, $U_2$, $U_3$, $U_4$ at the different operating stages. After comparison an error signal is obtained and used by the fourth regulator to create a fourth control signal. The fourth control signal is applied through the switch 22 to the input of the actuator for flow rate regulation 24 respectively 25 of the trating gas. The switch 22 is in a position which corresponds to the signal $W_G$ used to select the treating gas. If the signal $X_U$ is smaller than signal $W_U$ the actuator for flow rate regulation 24 respectively 25, remains closed. When the signal $X_U$ is greater than signal $W_U$ the actuator for flow rate regulation 24 respectively 25, opens and a treating gas enters the working chamber. The flow rate value of the treating gas corresponds to the value of the fourth control signal $W_G$. After introducing the treating gas in working chamber the pressure in the chamber grows up and as a result the glow discharge voltage decreases which is measured again with the voltage sensor 5. The decrease of glow discharge voltage continues until its value becomes equal to the preset value $U_1$. During the following operating stages the control of glow discharge voltage is carried out using the above-described actions so that constant values of glow discharge voltage are established in accordance with the preset values $U_2$, $U_3$, $U_4$. At the output of frequency-to-voltage converter 15 a signal $X_f$ is obtained corresponding to the value of the frequency of occurring arc discharges. The second comparing element 13 compares the signal $X_f$ eith signal $W_f$ which corresponds to the preset value of arc discharge frequency $f_1$. After comparison an error signal is obtained and used by second regulator 14 to create a second control signal. At the output of temperature sensor 8 a signal $X_T$ is obtained which corresponds to the workpiece temperature T. The first comparing element 9 compares the signal $X_T$ with signal $W_T$ which corresponds to the preset values $T_1$, $T_2$, $T_3$, $T_4$ at different operating stages. After comparison an error signal is obtained and used by the the first regulator 11 to create a first control signal. The adder 12 sums up the first and second signals and the resulting compound signal is applied to the first input of the third comparing element 16. The third comparing element 16 compares the compound signal, representing e setting signal $W_I$, with the signal $X_I$. The signal $X_I$ corresponds to the measured value of the discharge current I. After comparison an error signal is obtained and used by the third regulator 17 to create a third control signal. The third control signal controls the output voltage of the DC voltage source 1 so that the current through the working chamber I has a value which corresponds to the setting signal $W_I$ representing the sum of the control signals for the frequency of occurring arc discharges $f_1$ and the treated workpiece temperature $T_1$, $T_2$, $T_3$, $T_4$ during the operating stages.

What we claim is:

1. A method of controlling thermochemical treatment of workpieces in glow discharge in a medium of treating gas; said method involving a state of workpiece warm-up with simultaneous intensive cathode sputtering on their surface, a stage of diffusion saturation of workpieces and a stage of workpiece cooling; the workpiece temperature and the frequency of occurring arc discharges being measured during these stages; the measured values are compared with the corresponding preset values and error are signals obtained and used to create control signals characterized by the fact that at stage of workpiece warm-up with simultaneous intensive cathode sputtering on their surface the glow discharge voltage has at least one constant value corresponding to a preset value at which the workpiece cathode sputtering has a preset intensity, that at the stage of diffusion saturation at preset workpiece temperature the glow dicharge voltage has another at least one constant value corresponding to at least one preset value at which the desired workpiece properties are obtained, that at the stage of cooling the glow discharge voltage has at least one third constant value corresponding to at least one preset value at which the final properties of workpieces are obtained; during said operating stages the frequency of occurring arc discharges having arbitrary value limited in magnitude to a preset constant value of the arc discharge frequency, the workpiece temperature always having a value which corresponds to a preset increasing, constant, and decreasing value of workpiece temperature, said value being matched with the fore-mentioned at least one preset value of glow discharge voltage at which the preset intensity of cathode sputtering and the desired and final properties of workpieces are obtained; during said operating stages treating gases being used in an order which corresponds to a sequence of preset values of the glow discharge voltage, all this being controlled by regulating the flow rate of treating gases; during each operating stage besides the workpiece temperature and the frequency of occurring arc discharges, the glow discharge current and the amplitude of glow discharge current being also measured, besides the measured values of the workpiece temperature and the frequency of occurring arc discharges, the amplitude of glow discharge voltage being also compared with its preset value and the error signals obtained for the temperature and the frequency are used to create simultaneously corresponding control signals for the temperature and the frequency which are added together, and the resulting compound signal is compared with a signal proportional to the discharge current, after said comparison an error signal being obtained and used to create a control signal for the glow discharge voltage so that in accordance with the PID law the glow discharge current corresponds to the compound signal of the control signals for said temperature and said frequency, the error signal for the amplitude of glow discharge voltage is used to create a control signal for the treating gas flow rate so that in accordance with another PID law the amplitude of glow discharge voltage corresponds to the preset value.

2. A device for controlling thermochemical treatment of workpieces in glow discharge in a medium of treating gas in accordance with claim 1; including a source of DC voltage; said workpieces in the working chamber being connected thermally with a temperature sensor which is connected through a first comparing element to a first regulator; the gas output of the working chamber being lead to the outside atmosphere by a vacuum pump; said device including a voltage sensor whose output is connected through a series circuit of a frequency-to-voltage converter and a second comparing element with the input of a second regulator; a source of preset constant value for the arc discharge frequency being connected to the second input of the second comparing element which is characterized by the fact that one terminal of DC voltage source (1) is connected by a current sensor (2) to the corresponding terminal of the electric input of working chamber (3), the other terminal of DC voltage source (1) being connected through smoothing choke (4) to the other terminal of the electric input of working chamber (3), a voltage sensor (5) and an unit for arc discharge interruption (6) being mounted across said electric input; the second input of the first comparing element (9) being connected with the first output for preset value of the workpiece temperature of a programming unit (I0); the output of the first regulator (11) being connected with the first input of an adder (I2) whose output is connected with the first input of a second comparing element (I3), the seconf input of said second comparing being connected with the output of current sensor (2), and the output of said second comparing element being connected through a second regulator (I4) to the control input of DC voltage source (1); the output of a third regulator (I7) being connected with the second input of the adder (I2); the output of the voltage sensor (5) being also connected through an amplitude detector (I9) to the first input of a fourth comparing element (20) whose output is connected through a fourth regulator (21) to the first input of a switch (22); the second control input of said switch being connected with the second output for a preset treating gas of the programming unit (I0) whose third output for presetting the amplitude of the glow discharge voltage is connected with the second input of the fourth comparing element (20); the outputs of a source of treating gases (23) are connected to the gas inputs of at least two actuators for flow rate regulation (24 respectively 25) whose outputs are connected to the gas input of the working chamber (3); the control inputs of the actuators for flow rate regulation (24 respectively 25) are connected with the corresponding outputs of the switch (22).

* * * * *